(12) United States Patent
Uehara

(10) Patent No.: US 6,262,934 B1
(45) Date of Patent: Jul. 17, 2001

(54) MEMORY CIRCUIT INCLUDING WORD LINE RESET CIRCUIT AND METHOD OF RESETTING WORD LINE

(75) Inventor: Hidenori Uehara, Tokyo (JP)

(73) Assignee: Oki Electric Industry Co., Inc., Tokyo (JP)

( * ) Notice: Subject to any disclaimer, the term of this patent is extended or adjusted under 35 U.S.C. 154(b) by 0 days.

(21) Appl. No.: 09/551,942

(22) Filed: Apr. 19, 2000

(30) Foreign Application Priority Data

Oct. 29, 1999 (JP) .................................................. 11-308089

(51) Int. Cl.[7] .................................................. G11C 8/00
(52) U.S. Cl. .................................. 365/230.06; 365/189.08
(58) Field of Search .............................. 365/230.06, 239, 365/194, 189.08

(56) References Cited

U.S. PATENT DOCUMENTS

| | | | |
|---|---|---|---|
| 4,581,722 | * | 4/1986 | Takemae ................................ 365/230 |
| 4,628,486 | | 12/1986 | Sakui . |
| 5,257,238 | | 10/1993 | Lee et al. . |
| 5,410,508 | | 4/1995 | McLaury . |
| 5,416,747 | | 5/1995 | Ohira . |
| 5,519,665 | * | 5/1996 | Chishiki ........................... 365/230.06 |
| 5,617,369 | | 4/1997 | Tomishima et al. . |

FOREIGN PATENT DOCUMENTS

| | | |
|---|---|---|
| 0 559 995 A1 | 9/1993 | (EP) . |
| 08087884 | 4/1996 | (JP) . |
| 09073789 | 3/1997 | (JP) . |
| 10283778 | 10/1998 | (JP) . |
| 11250655 | 9/1999 | (JP) . |

* cited by examiner

Primary Examiner—David Nelms
Assistant Examiner—Thong Le
(74) Attorney, Agent, or Firm—Jones Volentine, PLLC

(57) ABSTRACT

A memory circuit includes a memory cell array having word lines, bit lines and memory cells, and a word line reset circuit for applying an activation level to a word line that is selected, and for applying a lower level which is lower than a deactivation level to the word line when it is non-selected. The word line reset circuit includes a first driver for applying the activation level to the selected word line during a first selected period, a second driver for applying the deactivation level to the word line during a second select period after the first select period, and a third driver for applying the lower level to the word line during a period other than the first and second select periods.

24 Claims, 2 Drawing Sheets

MEMORY CIRCUIT INCLUDING WORD LINE RESET CIRCUIT AND METHOD OF RESETTING WORD LINE

BACKGROUND OF THE INVENTION

1. Field of the Invention

The present invention relates to a semiconductor memory circuit, and more particularly relates to a word line reset circuit for a semiconductor memory circuit and a word line reset method.

2. Description of the Related Art

FIG. 3 is a partial circuit diagram of a semiconductor memory circuit. As shown in FIG. 3, a large number of memory cells 10 (only some of which are shown in FIG. 3, with the remainder being omitted) are arrayed horizontally and vertically, so as to comprise a memory cell array 12. The memory cell array 12 is arranged in a grid, with word lines 14 and bit lines 16 at right-angles with respect to each other. Each memory cell 10 is then connected to one word line 14 and one bit line 16.

In the case of the one transistor, one capacitor-type DRAM memory cell 10 shown in FIG. 3, a transistor gate is connected to a word line 14 and another terminal of the transistor is connected to a bit line 16. Word line driver circuits (hereinafter referred to as word line reset circuits) 18 are connected to the word lines 14. A word line reset circuit 18 selects one of the word lines 14 and applies an H-level potential to the selected word line 14. This turns the transistor of the memory cell 10 connected to the selected word line 14 on and the charge of a capacitor is transmitted to the bit line 16. On the other hand, L-level potentials are applied to word lines that are not selected. As a result, transistors of memory cells 10 connected to unselected word lines 14 are off and capacitor charge is held without being transmitted to the bit lines 16.

When another word line 14 is then subsequently selected, it is necessary to make the H-level of the previously selected word line an L-level. This operation is referred to as a "reset", and in related memory circuits this is achieved by connecting previously selected word lines 14 to an earth supply line at an L-level.

If a connected word line 14 is put to ground, a transistor of a memory cell 10 is turned off. However, the potential of the earth line temporarily rises because the charge on the selected word line flows to the earth supply line due to this reset operation. This situation is referred to as the occurrence of noise, and in this case the potential of non-selected word lines temporarily rises above ground. This results in the problem of charge leaking to bit lines from capacitors of memory cells 10 connected to unselected word lines. Ways of making the potential of unselected word lines lower than ground are disclosed in Japanese Patent Laid-open Publication Nos. Hei. 9-134591 and 11-250655, and U.S. Pat. Nos. 5,617,367 and 5,410,508.

However, even if the level of unselected word lines is set to a lower level than ground, noise occurs when the word lines are reset and charge accumulated at the capacitors of the memory cells leaks.

SUMMARY OF THE INVENTION

It is therefore the object of the invention to provide a memory circuit including a word line reset circuit where the occurrence of noise at the time of resetting word lines is lowered and leaking of charge from memory cells connected to unselected word lines is reduced.

In order to achieve the aforementioned object, a memory circuit of the invention comprises a memory cell array having word lines, bit lines and memory cells each connected to one of the word lines and one of the bit lines, and a word line reset circuit connected to one of the word lines for applying a word line activation level when the connected word line is selected, and for applying a lower level which is lower than a word line deactivation level to the connected word line when the connected word line is not selected. The word line reset circuit comprises a first driver circuit for applying the word line activation level to the connected word line during a first select period where the connected word line is selected, a second driver circuit for applying the word line deactivation level to the connected word line during a second select period starting after the first select period where the connected word line is selected, and a third driver circuit for applying the lower level to the connected word line during a period other than the first and second select periods.

Various embodiments of the present invention have been shown in brief. However, the various embodiments of the present invention and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
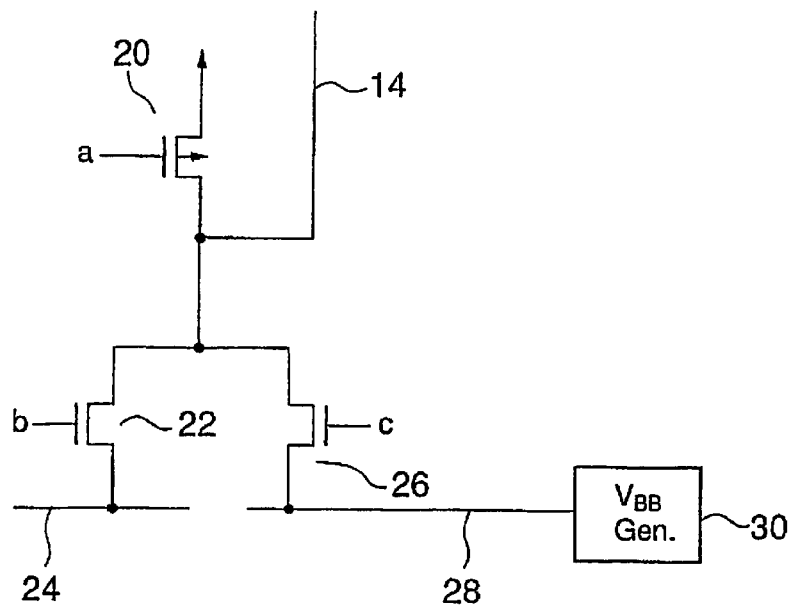
FIG. 1 a circuit diagram of a word line reset circuit of an embodiment of the present invention.

Preferred embodiments of the present invention will hereinafter be described with reference to the accompanying drawings. Incidentally, the sizes, forms and layouts of respective components in the drawings are merely diagrammatically illustrated to such an extent as to allow the understanding of the present invention. It should be understood that numerical conditions to be described below are mere illustrations.

Figure 3:
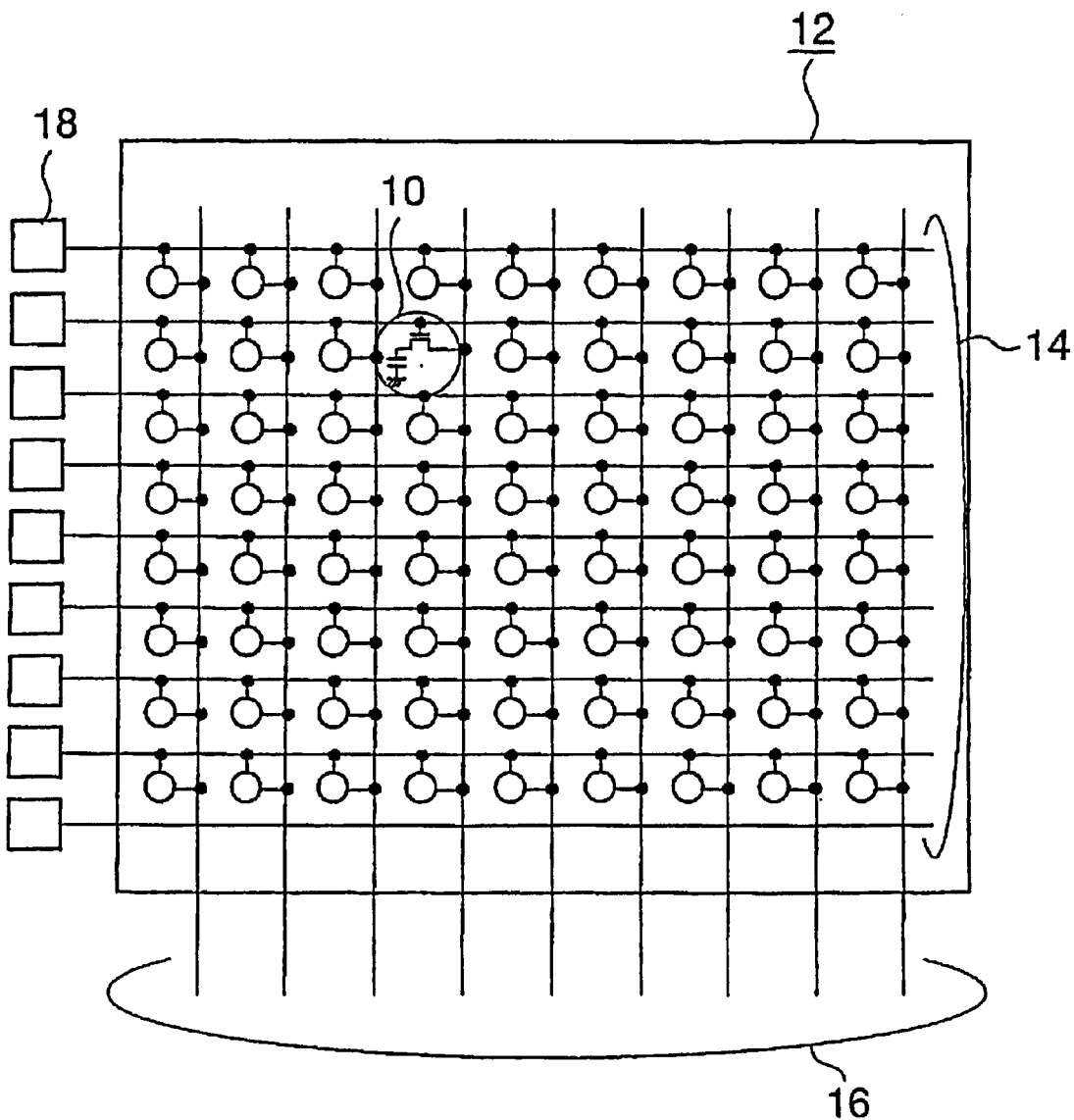
FIG. 3 is a partial circuit diagram of a semiconductor memory circuit.

FIG. 1 is a circuit diagram of a word line reset circuit of an embodiment of the present invention. In FIG. 1 only one word line reset circuit is shown but this word line reset circuit is just one of many word line reset circuits 18 connected to word lines 14 of the memory cell array 12 shown in FIG. 3, with the semiconductor memory circuit as a whole including the memory cell array of FIG. 3.

A potential level for turning a memory cell transistor ON is referred to as a word line activation level or a word line select level. In FIG. 1, a first driver circuit for applying a first potential, being a word line activation level, to a word line comprises a PMOS transistor 20. As the first potential is sufficient to turn a memory cell transistor on, in this embodiment, the power supply potential (Vcc) is employed as the first potential (refer to FIG. 2) but a higher potential (Vcc+a) than the power supply potential (Vcc) can also be employed as the first potential. The drain of the PMOS transistor 20 is connected to word line 14. The source of the PMOS transistor 20 is connected to a power supply potential line connected to the power supply potential. In FIG. 1, connection to this power supply potential line is shown simply by arrows. The sources of PMOS transistors 20 of other word line reset circuits 18 are also connected in common to the power supply potential line.

Figure 2:
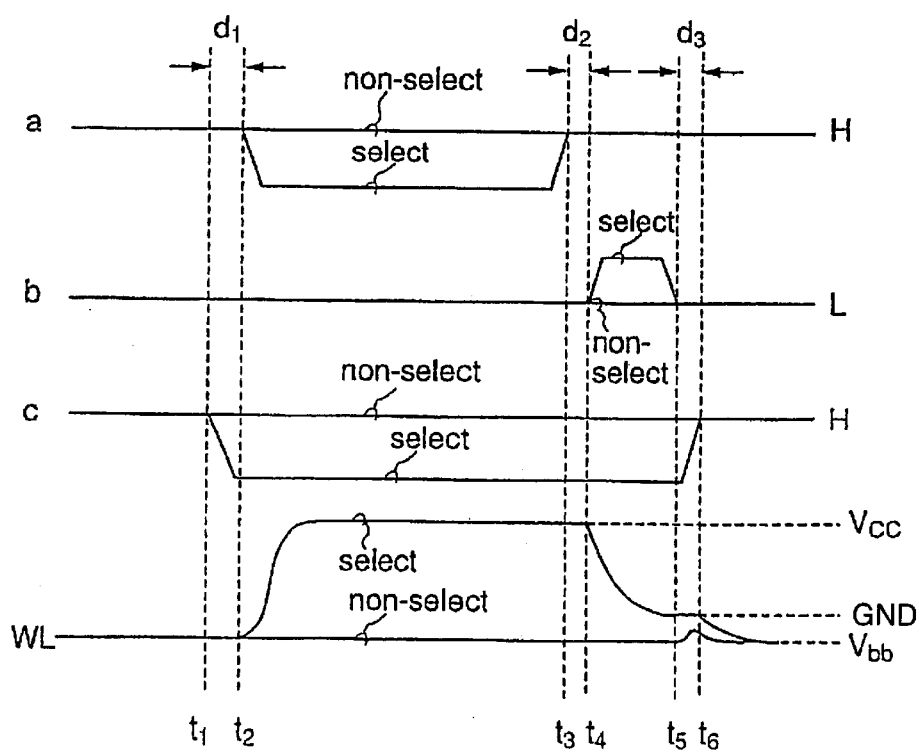
FIG. 2 is a timing chart showing timing of the operations of the word line reset circuit shown in FIG. 1.

A first signal a is applied to the gate of the PMOS transistor 20. This first signal a, which will be described in detail when FIG. 2 is described, is an L level in a first selection period that is an initial stage of selection when selecting a corresponding word line 14.

A potential level for turning a memory cell transistor OFF is referred to as a word line deactivation level or a word line deselect level. A second driver circuit applying a ground (GND) (intermediate potential), being the word line deactivation level, to the word line 14, comprises a first NMOS transistor 22. The drain of the first NMOS transistor 22 is connected to word line 14, and the source is connected to earth supply line 24. The sources of the first NMOS transistors 22 of the other word line reset circuits 18 are also connected in common to the earth supply line 24, as with the sources of the PMOS transistors 20.

A second signal b is applied to the gate of the first NMOS transistor 22. The second signal b, which is described in detail when describing FIG. 2, is an H level in a second select period following the first select period.

A third driver circuit, applying a second potential (Vbb) of a lower potential than the word line deactivation level to the word line 14, comprises a second NMOS transistor 26. The second potential is generated internally by a low potential generating circuit 30. The drain of a second NMOS transistor 26 is connected to a word line 14, and the source is connected to a low potential line 28 connected to the low potential generating circuit 30. The sources of the second NMOS transistors 26 of the other word line reset circuits 18 are also connected in common to the low potential line 28, as with the sources of the PMOS transistors 20.

A third signal c is applied to the gate of the second NMOS transistor 26. This third signal c, which is described in detail when FIG. 2 is described, is an L level during the first select period and the second select period.

FIG. 2 is a timing chart showing timing of the operations of the word line reset circuit shown in FIG. 1. The potential levels of the first to third signals a to c and the word line (WL in FIG. 2) are now described for each time with reference to FIG. 2.

Up to time t1

The PMOS transistor 20 and the first NMOS transistor 22 are off because the first signal a is an H-level and the second signal b is an L-level. On the other hand, the second NMOS transistor 26 is ON because the third select signal is an H-level. The word line WL therefore becomes the second potential level (Vbb).

Time t1

At the time t1, first, the third signal c selected for application to the word line reset circuit connected to the selected word line WL changes from an H to an L-level. At this time, other unselected third signals c are kept at H levels. The first signal a and second signal b are then kept at an H level and an L level respectively, regardless of selection or non-selection. At this time, the word line WL is not connected to anywhere, but the second potential level (Vbb) is maintained.

Time t2

The start of the first select period begins when one of the word lines is selected at time t2. The first signal a applied to the word line reset circuit connected to the word line WL selected soon after the time t1 (after the infinitesimal time d1 shown in FIG. 2) changes from an H level to an L level. At this time, other unselected first signals a are kept at H levels. As a result, the PMOS transistor 20 of the selected word line reset circuit is turned on, and the selected word line WL is charged from the second potential level (Vbb) to the power supply potential (Vcc). The second signal b is then kept at an L level, regardless of selection or non-selection. The third signal c is kept at an L level at the selected word line reset circuit and an H level at the unselected word line reset circuit.

Changes in the third signal occurring at time t1 and changes in the first signal occurring at time t2 can be carried out simultaneously. In this case, these changes in the first and third signals would be carried out with the first select periods starting in synchronism.

In this embodiment, the change in the first signal is carried out an infinitesimal time d1 after the change in the third signal in order to prevent penetration current. If changing the first signal and changing the third signal is carried out in synchronism, there can be considered to be a period where the first signal applied to the selected word line reset circuit is an L level and the third signal is an H level, due to shifts in the timing. In this case, the PMOS transistor 20 of the selected word line reset circuit and the second NMOS transistor 26 come on simultaneously, and a penetration current flows to the low potential line 28 from the source of the PMOS transistor 20 via the second NMOS transistor 26. The PMOS transistor 20 and the second NMOS transistor 26 are therefore prevented from being ON at the same time as a result of shifting the timing by the infinitesimal time d1.

Time t3

After the time t2, the first signal a applied to the word line reset circuit connected to the selected word line WL changes from an L level to an H level. At this time, other unselected first signals a are kept at H levels. As a result, the PMOS transistor of the selected word line reset circuit is turned off. The selected word line WL is not connected to anywhere but the charged power supply potential (Vcc) is maintained. The second signal b is then kept at an L level, regardless of selection or non-selection. The third signal c is kept at an L level at the selected word line reset circuit and an H level at the unselected word line reset circuit.

The time t3 is the point at which the first select period ends.

Time t4

The second signal b applied to the word line reset circuit connected to word line WL selected soon after the time t3 (after the infinitesimal time d2 shown in FIG. 2) changes from an L-level to an H-level. At this time, other unselected second signals b are kept at L levels. As a result, the first NMOS transistor 22 of the selected word line reset circuit goes on, and the selected word line WL is charged from the power supply potential (Vcc) to ground level (GND). The first NMOS transistor is charged quickly because the dimensions of the first NMOS transistor are large and there is therefore the possibility of noise occurring at the earth supply line 24. However, other unselected word lines WL are not influenced by noise at all because the earth supply line 24 is only connected to the selected word line WL. The first signal a is held at an H-level regardless of selection or non-selection. The third signal c is kept at an L level at the selected word line reset circuit and an H level at the unselected word line reset circuit.

The time t4 is the point at which the second select period starts. Changes in the first signal occurring at time t3 and changes in the second signal occurring at time t4 can be carried out simultaneously. In this case, these changes would be carried out in synchronism with the start of the second select period.

In this embodiment, the change in the second signal is carried out an infinitesimal time d2 after the change in the first signal in order to prevent penetration current. If changing the second signal and changing the first signal is carried out in synchronism, there can be considered to be a period where the first signal applied to the selected word line reset circuit is an L level and the second signal is an H level, due to shifts in the timing. In this case, the PMOS transistor 20 of the selected word line reset circuit and the first NMOS transistor 22 come on simultaneously, and a penetration current flows to the earth supply line 24 from the source of the PMOS transistor 20 via the first NMOS transistor 22. The PMOS transistor 20 and the first NMOS transistor 22 are therefore prevented from being ON at the same time as a result of shifting the timing by the infinitesimal time d2.

Time t5

The second signal b applied to the word line reset circuit connected to the selected word line WL changes from an H-level to an L-level at a timing approximately where the potential of the word line WL selected after the time t4 is substantially discharged to ground (GND). At this time, other unselected second signals b are kept at L levels. As a result, the first NMOS transistor 22 of the selected word line reset circuit is turned off. The selected word line WL is not connected to anywhere but is kept discharged at substantially ground. The first signal a is held at an H-level regardless of selection or non-selection. The third signal c is kept at an L level at the selected word line reset circuit and an H level at the unselected word line reset circuit.

The time t5 is the point at which the second select period ends.

Time t6

The third signal c applied to the word line reset circuit connected to word line WL selected soon after the time t5 (after an infinitesimal time d3 shown in FIG. 2) changes from an L-level to an H-level. At this time, other unselected third signals c are kept at L levels. As a result, the second NMOS transistor 26 of the selected word line reset circuit is turned on, and the selected word line WL is charged from the ground (GND) to the second potential level (Vbb). Charging of the second NMOS transistor is slow because the dimensions of the second NMOS transistor are set to be small compared to the first NMOS transistor. There is therefore almost no noise on the unselected word lines WL and the low power supply line 28, as can be seen from the potential level of the unselected word lines WL of FIG. 2. As is shown in FIG. 2, the potential of the unselected word lines WL does not exceed ground (GND) even if noise occurs at this time, and charge does not leak from the capacitors of memory cells connected to the unselected word lines.

The first signal a is held at an H-level regardless of selection or non-selection. The second signal b is then kept at an L level, regardless of selection or non-selection.

Changes in the second signal occurring at time t5 and changes in the third signal occurring at time t6 can be carried out simultaneously. In this case, these changes can be carried out in synchronism with the end of the second select period.

However, in this embodiment, changing of the third signal is carried out an infinitesimal amount of time d3 after the changing of the second signal in order to prevent penetration current, and this is an extremely important point with respect to the effects of the present invention. If changing the third signal and changing the second signal is carried out in synchronism, there can be considered to be a period where the second signal applied to the selected word line reset circuit is an H level and the third signal is an H level, due to shifts in the timing. In this case, the first NMOS transistor 22 of the selected word line reset circuit and the second NMOS transistor 26 come on simultaneously, and a penetration current flows to the low potential line 28 from the source of the first NMOS transistor 22 via the second NMOS transistor 26. However, by shifting the timing by just the infinitesimal time d3, the first NMOS transistor 22 and the second NMOS transistor 26 can be prevented from coming on simultaneously, and the occurrence of noise can be reduced.

As described in detail above, according to a memory circuit including a word line reset circuit of this invention and a word line reset method, the influence of noise on unselected word lines at the time of resetting selected word lines can be reduced and leaking of charge from memory cells can be decreased.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A memory circuit comprising:

a memory cell array having a plurality of word lines, a plurality of bit lines and a plurality of memory cells each connected to one of the word lines and one of the bit lines; and a word line reset circuit, connected to one of the word lines, for applying a word line activation level when the connected word line is selected, and for applying a lower level which is lower than a word line deactivation level to the connected word line when the connected word line is not selected, wherein said word line reset circuit comprises:

a first driver circuit for applying the word line activation level to the connected word line during a first select period where the connected word line is selected;

a second driver circuit for applying the word line deactivation level to the connected word line during a second select period starting after the first select period where the connected word line is selected; and a third driver circuit for applying the lower lever to the connected word line during a period other than the first and second select periods.

2. The memory circuit of claim 1, wherein the word line activation level is a power supply potential level and the word line deactivation level is a ground level.

3. The memory circuit of claim 1, wherein the first driver circuit comprises a PMOS transistor having a source applied to the word line activation level, a drain connected to the connected word line, and a gate reciving a first signal having a low level during the first select period.

4. The memory circuit of claim 1, wherein the first and second driver circuits are disabled when the connected word line is not selected.

5. The memory circuit of claim 1, wherein the third driver circuit applies the lower level to the connected word line during the first and second select periods where the connected word line is not selected.

6. The memory circuit of claim 1, wherein the second driver circuit comprises a first NMOS transistor having a source applied to the word line deactivation level, a drain connected to the connected the word line, and a gate receiving a second signal having a high level during the second select period, and wherein the third driver circuit comprises a second NMOS transistor having a source applied to the lower level, a drain connected to the connected word line, and a gate receiving a third signal having the low level during the first and second select periods.

7. The memory circuit of claim 6, wherein a conductance of the first NMOS transistor is lower than a conductance of the second NMOS transistor.

8. The memory circuit of claim 6, wherein the third signal turns to the low level slightly before the first select period.

9. The memory circuit of claim 6, wherein the third signal turns to the high level slightly after the second select period.

10. The memory circuit of claim 1, wherein a minute period of time exists between an end of the first select period and a beginning of the second select period.

11. A memory circuit comprising:
a memory cell array having a plurality of word lines, a plurality of bit lines and a plurality of memory cells each connected to one of the word lines and one of the bit lines; and
a plurality of word line reset circuits, each of which is connected to one of the word lines, respectively, said word line reset circuits including a plurality of first reset circuits and a second reset circuit being selected among said word line reset circuits,
wherein the second word line reset circuit applies a word line activation level to the connected word line thereof during a first select period, and applies a word line deactivation level to the connected word line thereof during a second select period which starts after the first select period, and
wherein each of the first word line reset circuits applies a lower level which is lower than the word line deactivation level to the connected word line thereof during the first and second select periods.

12. The memory circuit according to claim 11, wherein each of said word line reset circuits includes
a first driver circuit for applying the word line activation level to the connected word line during the first select period,
a second driver circuit for applying the word line deactivation level to the connected word line during the second select period, and
a third driver circuit for applying the lower level to the connected word line during a period other than the first and second select periods.

13. The memory circuit according to claim 11, wherein the word line activation level is a power supply potential level and the word line deactivation level is a ground level.

14. The memory circuit according to claim 12, wherein the first driver circuit comprises a PMOS transistor having a source applied to the word line activation level, a drain connected to the connected word line, and a gate receiving a first signal having a low level during the first select period.

15. The memory circuit according to claim 12, wherein the second driver circuit comprises a first NMOS transistor having a source applied to the word line deactivation level, a drain connected to the connected word line, and a gate receiving a second signal having a high level during the second select period, and wherein the third driver circuit comprises a second NMOS transistor having a source applied to the lower level, a drain connected to the connected word line, and a gate receiving a third signal having a low level during the first and second select periods.

16. The memory circuit according to claim 15, wherein a conductance of the first NMOS transistor is lower than a conductance of the second NMOS transistor.

17. The memory circuit according to claim 15, wherein the third signal turns to the low level slightly before the first select period.

18. The memory circuit according to claim 15, wherein the third signal turns the high level slightly after the second select period.

19. The memory circuit according to claim 11, wherein a minute period of time exists between an end of the first select period and a beginning of the second select period.

20. A method for resetting word lines of a semiconductor memory having a plurality of word lines, comprising:
selecting one of the word lines so that the word lines include a selected word line and a plurality of non-selected word lines;
supplying a word line activation level to the selected word line and supplying a lower level which is lower than a word line deactivation level to non-selected word lines in a first select period;
supplying the word line deactivation level to the selected word line and supplying the lower level to non-selected word lines in a second select period following the first select period; and
supplying the lower level to all of the word lines in a period other than the first and the second select periods.

21. The method for resetting word lines of the semiconductor memory according to claim 20, wherein a minute period of time exists between an end of the first select period and a beginning of the second select period.

22. The method for resetting word lines of the semiconductor memory according to claim 20, wherein the lower level is gradually supplied to the word lines.

23. The method for resetting word lines of the semiconductor memory according to claim 20, wherein the lower level is supplied to the selected word line slightly after the second select period.

24. The method for resetting word lines of the semiconductor memory according to claim 20, wherein the lower level is continuously supplied to the non-selected word lines.

* * * * *

UNITED STATES PATENT AND TRADEMARK OFFICE
CERTIFICATE OF CORRECTION

PATENT NO. : 6,262,934 B1  
DATED : July 17, 2001  
INVENTOR(S) : Edith Mathiowitz et al.

It is certified that error appears in the above-identified patent and that said Letters Patent is hereby corrected as shown below:

<u>Title page,</u>  
Item [73], Assignee: should read as follows:  
-- [73] Assignee: Brown University Research Foundation,
        Providence, RI (US) --.

Signed and Sealed this

Twenty-third Day of April, 2002

*Attest:*

*Attesting Officer*

JAMES E. ROGAN  
*Director of the United States Patent and Trademark Office*

UNITED STATES PATENT AND TRADEMARK OFFICE
CERTIFICATE OF CORRECTION

PATENT NO.     : 6,262,934 B1
DATED          : July 17, 2001
INVENTOR(S)    : Hidenori Uehara It is certified that error appears in the above-identified patent and that said Letters Patent is hereby corrected as shown below:

This certificate supersedes Certificate of Correction issued April 23, 2002. The certificate was issued in error and should be deleted.

Signed and Sealed this

Twenty-fifth Day of June, 2002

*Attest:*

*Attesting Officer*

JAMES E. ROGAN
*Director of the United States Patent and Trademark Office*